US008371795B2

United States Patent
Kitahara et al.

(10) Patent No.: US 8,371,795 B2
(45) Date of Patent: Feb. 12, 2013

(54) WORKPIECE TRANSFER SYSTEM (75) Inventors: Yasuyuki Kitahara, Nagano (JP);
Shigeyuki Kaino, Nagano (JP)

(73) Assignee: Nidec Sankyo Corporation (JP)

( * ) Notice: Subject to any disclaimer, the term of this patent is extended or adjusted under 35 U.S.C. 154(b) by 292 days.

(21) Appl. No.: 12/302,954

(22) PCT Filed: Nov. 26, 2007

(86) PCT No.: PCT/JP2007/001299
§ 371 (c)(1),
(2), (4) Date: Jun. 15, 2009

(87) PCT Pub. No.: WO2008/065747
PCT Pub. Date: Jun. 5, 2008

(65) Prior Publication Data
US 2010/0150688 A1 Jun. 17, 2010

(30) Foreign Application Priority Data

Nov. 27, 2006 (JP) .................................. 2006-318310

(51) Int. Cl.
*B65G 65/34* (2006.01)
(52) U.S. Cl. ................. 414/416.03; 414/744.5; 414/937
(58) Field of Classification Search .................. 414/217, 414/416.03, 744.1, 744.2, 744.4, 744.5, 744.6, 414/935, 937, 589, 590, 217.1, 331.01, 332, 414/403
See application file for complete search history.

(56) References Cited

U.S. PATENT DOCUMENTS

| 4,836,733 A * | 6/1989 | Hertel et al. ............... 414/744.5 |
| 6,297,611 B1 | 10/2001 | Todorov et al. |
| 6,514,032 B1 * | 2/2003 | Saino et al. ................ 414/744.1 |
| 6,575,691 B1 * | 6/2003 | Saeki ......................... 414/744.5 |
| 6,712,579 B2 * | 3/2004 | Fujii et al. .................. 414/744.5 |
| 7,547,175 B2 * | 6/2009 | Chinbe et al. ............ 414/416.03 |
| 8,136,422 B2 * | 3/2012 | Kitahara et al. ............. 74/490.1 |

FOREIGN PATENT DOCUMENTS

| JP | 7-122618 | 5/1995 |
| JP | 2004-502558 | 1/2004 |
| JP | 2006-73834 | 3/2006 |
| JP | 2006-289555 | 10/2006 |
| WO | 02/04176 | 1/2002 |

OTHER PUBLICATIONS

International Search Report for International Application No. PCT/JP2007/001299 mailed Jan. 29, 2008 with English Translation.

* cited by examiner

*Primary Examiner* — Saul Rodriguez
*Assistant Examiner* — Glenn Myers
(74) *Attorney, Agent, or Firm* — Cantor Colburn LLP (57) ABSTRACT

A workpiece transfer system may include a plurality of cassettes for storing workpieces, at least one workpiece processing apparatus, and a multi-joint industrial robot for loading and unloading workpieces to/from the cassettes. The multi-joint industrial robot may include a hand part for holding a workpiece, an arm part supporting the hand part so as to make the hand part rotatable, and a link mechanism that supports an arm joint part, positioned at a base side of the arm part, so as to make the arm joint part rotatable.

7 Claims, 5 Drawing Sheets

WORKPIECE TRANSFER SYSTEM

CROSS REFERENCE TO RELATED APPLICATIONS

This is a U.S. national stage of application No. PCT/JP2007/001299, filed on Nov. 26, 2007. Priority under 35 U.S.C. §119(a) and 35 U.S.C. §365(b) is claimed from Japanese Application No. 2006-318310, filed Nov. 27, 2006 the disclosure of which is also incorporated herein by reference.

FIELD OF THE INVENTION

The present invention relates to a workpiece transfer system including a multi-joint industrial robot to be used for loading & unloading a workpiece to/from a cassette.

BACKGROUND

Used for loading and unloading a workpiece such as a semiconductor wafer to/from a cassette is a multi-joint industrial robot, in which multiple arms are connected each other so as to be rotatable and carry out expanding/folding motion by making use of transmission of turning power from a turning drive power supply. Then, a workpiece transfer system includes a plurality of cassettes in which workpieces are stored, a workpiece processing apparatus, and the multi-joint industrial robot. A conventional workpiece transfer system (Refer to Patent Document 1 for example) is described in detail with reference to FIG. 5.

Figure 5:
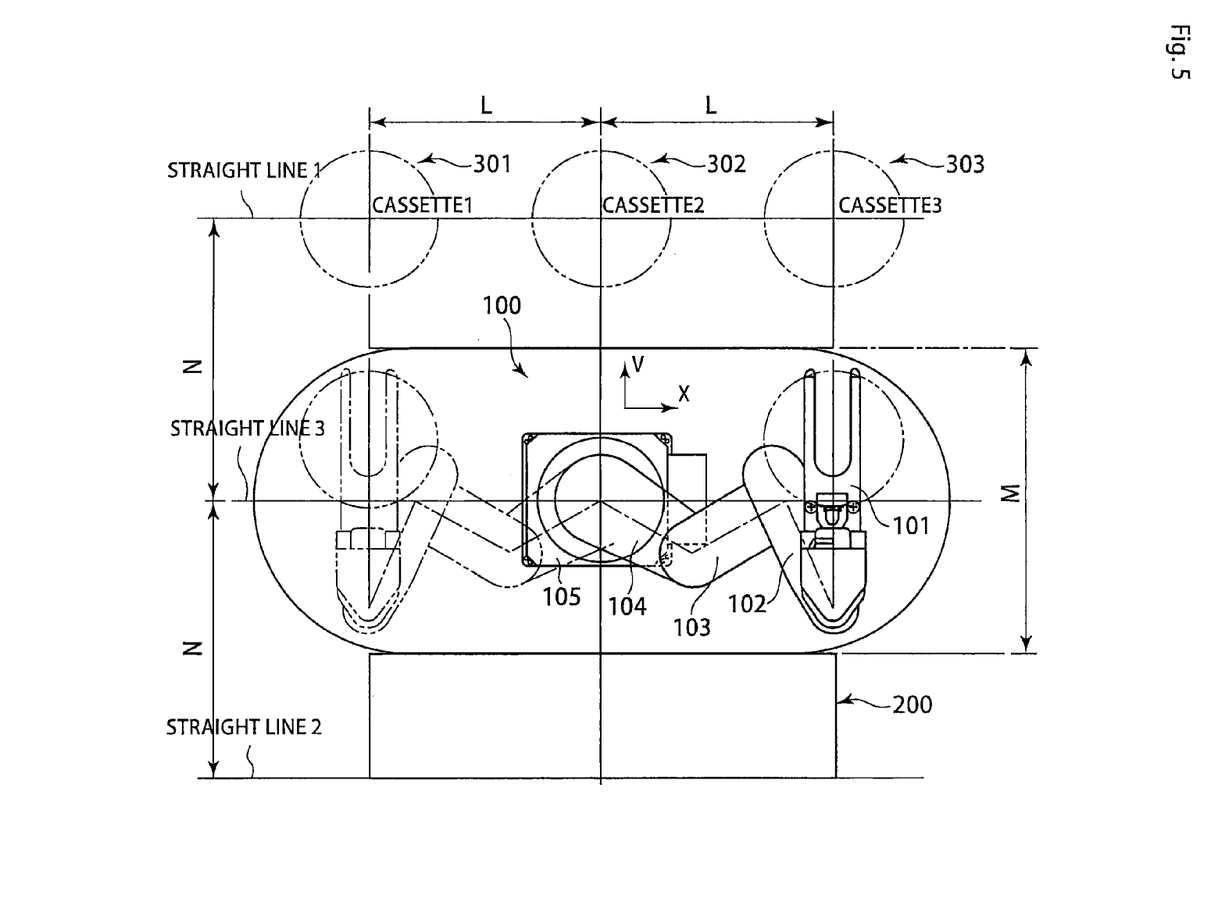
FIG. 5 shows a system structure of a conventional workpiece transfer system.

As shown in FIG. 5, the conventional workpiece transfer system includes: a multi-joint industrial robot 100, a workpiece processing apparatus 200, and a plurality of cassettes (e.g., cassettes C1, C2, C3) in which a workpiece 301 through a workpiece 303 are stored. Workpieces are mounted onto shelves of the cassettes, and the multi-joint industrial robot 100 loads and unloads a workpiece to/from each shelf of the cassette. On this occasion, assumed as the cassette for example is a so-called 'FOUP' (Front-Opening Unified Pod) type cassette, a cassette-integrated front-opening unified pod for transfer operation and storage, specified in item E47.1 of SEMI (Semiconductor Equipment and Materials International) standards. The plurality of cassettes are placed in parallel at regular intervals. The multi-joint industrial robot 100 includes: a hand part 101, an arm part 102, an arm-side link part 103, a base-side link part 104, and a base 105; and the multi-joint industrial robot 100 is prepared to carry out, for example, taking the workpiece 303 out of a cassette (the cassette 3) and transferring the workpiece 303 to the workpiece processing apparatus 200.

The multi-joint industrial robot 100 is located at a middle position between the workpiece processing apparatus 200 and the plurality of cassettes (cassettes C1, C2, C3). More concretely to describe; where a straight line connecting each center of the workpiece 301 through the workpiece 303 stored in the plurality of cassettes is defined as a straight line S1 while another straight line included at the rear side of the workpiece processing apparatus 200 and being parallel with the straight line S1 is defined as a straight line S2, the multi-joint industrial robot 100 is located on a straight line S3 composed of points that are equally distant from the straight line 1 and the straight line S2.

On the occasion of the workpiece transfer system shown in FIG. 5, a 3-'FOUP' unit dealing with the 3 cassettes that store 3 workpieces, i.e., the workpiece 301 through the workpiece 303, is employed. When a 4-'FOUP' unit dealing with the 4 cassettes is employed instead; all or at least a part of the arm part 102, the arm-side link part 103, and the base-side link part 104 needs to be elongated in their length. In a case dealing with 5 cassettes or more, such elongation in those parts is also required.

[Patent Document 1]
Japanese Unexamined Patent Publication (Kokai) No. JP2006-289555

When all or a part of the arm part 102, the arm-side link part 103, and the base-side link part 104 is elongated in their length, it becomes possible to access in a further distance in the X-direction on FIG. 5 (to enable dealing with 4-'FOUP' unit). Unfortunately in this case, an interference area of the industrial robot is enlarged in the Y-direction on FIG. 5. Accordingly, an entire section of the multi-joint industrial robot 100 and an entire system of the workpiece transfer system as well are enlarged (so that the industrial robot requires a wide installation space). In the case that FIG. 5 describes for example; the interference area having the dimension 'M' in the Y-direction on FIG. 5, i.e., an area required for work of the industrial robot (where the industrial robot can carry out its work with neither interfering with the cassettes in which the workpieces are stored nor interfering with the workpiece processing apparatus), becomes enlarged and eventually the dimension 'N' also becomes greater.

At least an embodiment of the present invention has been materialized from the viewpoint of the problem described above. Namely, at least an embodiment of the present invention provides a workpiece transfer system that prevents the system itself as a whole from becoming larger so as to enable space-saving of the system even when the system deals with numbers of cassettes.

SUMMARY

To solve the problem described above, at least an embodiment of the present invention provides the following aspects:

(1) A workpiece transfer system, comprising: a plurality of cassettes for storing workpieces; at least one workpiece processing apparatus placed at a position opposing the line of the plurality of cassettes; and a multi-joint industrial robot for loading and unloading workpieces to/from the cassettes; the multi-joint industrial robot including, a hand part for holding a workpiece, an arm part supporting the hand part so as to make the hand part rotatable, and a link mechanism that supports an arm joint part, positioned at a base side of the arm part, so as to make the arm joint part rotatable, and operates in such a manner that a motion trajectory of the arm joint part becomes a straight line almost perpendicular to the direction of loading and unloading the workpieces; the link mechanism having a base-side link part supported by the base of the multi-joint industrial robot so as to be rotatable, and an arm-side link part positioned at a side of the arm part while the base-side link part and the arm-side link part are connected by a link joint part; wherein the plurality of cassettes are placed in a row in parallel with the motion trajectory of the arm joint part; a rotation center of the base-side link part of the link mechanism and a rotation center of the arm joint part are located at a position that is shifted toward a side of one of the workpiece processing apparatus and the plurality of cassettes away from a middle position between the workpiece processing apparatus and the plurality of cassettes; and the link joint part gets folded to protrude in a direction opposite to the above shifted position at the time of loading and unloading the workpieces to/from the plurality of cassettes and the workpiece processing apparatus according to operation of the link mechanism.

According to at least an embodiment of the present invention, the workpiece transfer system includes: the plurality of cassettes, the workpiece processing apparatus, and the multi-joint industrial robot. The multi joint industrial robot includes: the hand part for holding a workpiece, the arm part supporting the hand part so as to make the hand part rotatable, and the link mechanism in which a motion trajectory of the arm joint part, positioned at the base side of the arm part, becomes a straight line almost perpendicular to a direction of loading and unloading the workpiece. Meanwhile, in the link mechanism, the base-side link part and the arm-side link part are connected by the link joint part. In the workpiece transfer system, the plurality of cassettes are placed in a row in parallel with the motion trajectory of the arm joint part, the rotation center of the base-side link part of the link mechanism and the rotation center of the arm joint part are located at a position that is shifted toward a side of one of the workpiece processing apparatus and the plurality of cassettes away from the middle position between the workpiece processing apparatus and the plurality of cassettes, and the link joint part gets folded to protrude in a direction opposite to the above shifted position at the time of loading and unloading the workpieces to/from the plurality of cassettes and the workpiece processing apparatus according to operation of the link mechanism. Therefore, even when the lengths of the arm part as well as each part of the link mechanism become longer for example, the workpiece transfer system according to the present embodiment makes it possible to prevent the protruding link joint part of the link mechanism from a collision with any of the workpiece processing system and cassette cases storing the plurality of cassettes.

Accordingly, the workpiece transfer system prevents the system itself as a whole from becoming larger and eventually enables space-saving of the system.

"The middle position" between the workpiece processing apparatus and the plurality of cassettes may be, for example, a position of a straight line composed of points that are equally distant from a straight line S1 and a straight line S2 where the straight line S1 is a straight line connecting the centers of the workpieces stored in the plurality of cassettes while the straight line S2 is another straight line included at a rear side of the workpiece processing apparatus and being parallel with the straight line S1. Moreover, in order for the hand part not to interfere with any of the workpiece processing apparatus and the plurality of cassettes, "the middle position" between the workpiece processing apparatus and the plurality of cassettes may be selected from the group consisting of: a middle position between a surface of the workpiece processing apparatus and a surface of the plurality of cassettes, the two surfaces opposing each other; a middle position between the workpiece processing apparatus and the plurality of cassettes in a workspace of the multi-joint industrial robot between the workpiece processing apparatus and the plurality of cassettes; and a middle position between a furthest reachable point of the hand part in a direction toward the workpiece processing apparatus and a furthest reachable point of the hand part in a direction toward the plurality of cassettes.

Furthermore, any of the hand part, the arm part, the base-side link part, and the arm-side link part may be elongated in their length. Any one of them or more may be elongated. It is preferable that the ratio in rotation angles of the base-side link part 4 and the arm-side link part 5 is 1:2, while these two components are the same in their length. Under this condition, linear interpolation can be carried out easily. Furthermore, since the length of the hand part is unchanged, the hand part can be commonly used for both a 3-'FOUP' unit and a 4-'FOUP' unit so that the versatility is improved.

In at least an embodiment of the present invention, not only the rotation center of the base-side link part of the link mechanism but also the rotation center of the arm joint part are located at a position that is shifted away from "the middle position". Therefore, being compared with a case where, for example, only the rotation center of the base-side link part of the link mechanism is located at "the middle position"; the above embodiment easily enables the interpolation (linear interpolation or pseudo linear interpolation).

(2) The workpiece transfer system in which an arm-swinging space of the arm part is restricted at a side of the above shifted position.

According to at least an embodiment of the present invention, the arm-swinging space of the arm part is restricted at the side of the above shifted position. Therefore, the workspace of the arm part is limited to a certain range, and eventually it becomes possible to use the installation space for the workpiece transfer system more efficiently. Concretely to describe, the arm part may be structured so as to become enabled to swing for a range of 240 degrees at a side opposite to the side of the above shifted position.

As described above, in the multi-joint industrial robot according to at least an embodiment of the present invention, the rotation center of the base-side link part and the rotation center of the arm joint part are located at a position that is shifted toward a side of one of the workpiece processing apparatus and the plurality of cassettes away from the middle position between the workpiece processing apparatus and the plurality of cassettes. Therefore, even if the number of cassettes is increased (for example, to be changed from a 3-'FOUP' unit to a 4-'FOUP' unit) and some parts of the multi-joint industrial robot are elongated, it is still possible to prevent the link joint part of the link mechanism from a collision with any of the workpiece processing system and the cassette cases. As a result, it becomes possible to prevent the workpiece transfer system as a whole from becoming larger and to contribute to space-saving of the system.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DESCRIPTION OF THE PREFERRED EMBODIMENT

Preferred embodiments are described below with reference to the accompanying drawings.

(System Structure)

Figure 1:
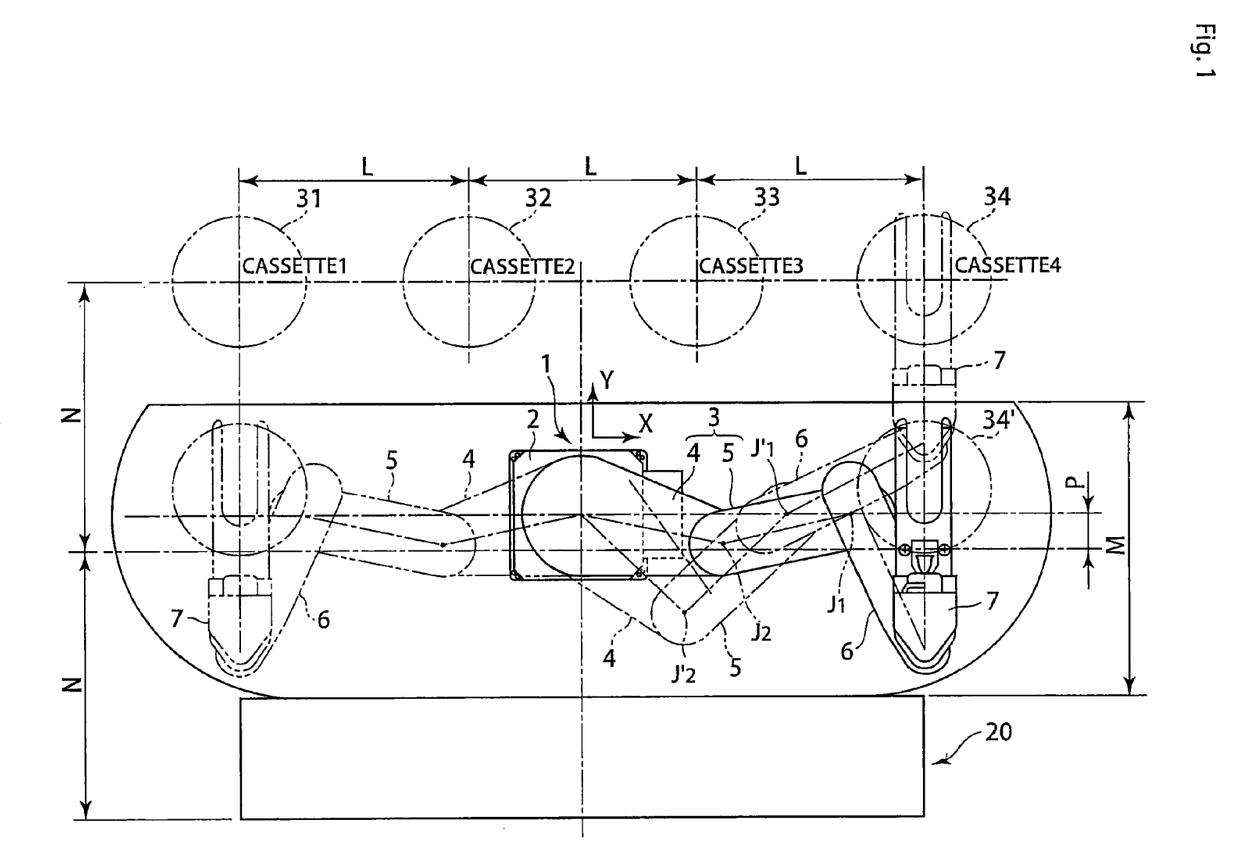
FIG. 1 shows a system structure of a workpiece transfer system according to an embodiment.

FIG. 1 shows a system structure of a workpiece transfer system according to an embodiment of the present embodiment. Shown in FIG. 1 are 3 postures of a multi-joint industrial robot 1.

In FIG. 1, the workpiece transfer system includes: the multi-joint industrial robot 1, a workpiece processing apparatus 20, and four cassettes C1, C2, C3, C4 (as a 4-'FOUP' unit) in which workpieces 31, 32, 33, 34 (circular semiconductor wafers for example) are stored individually. Reference numeral 34' indicates an example of a workpiece that is located outside of the cassette C4.

The multi-joint industrial robot 1 loads and unloads the workpieces 31, 32, 33, 34 to/from the cassettes C1, C2, C3, C4. The multi-joint industrial robot 1 includes: a hand part 7 for holding each of the workpieces; an arm part 6 supporting the hand part 7 so as to make the hand part rotatable; a link mechanism 3 which supports an arm joint part J1, positioned at a base side of the arm part 6, so as to make the arm joint part rotatable, and operates in such a manner that a motion trajectory of the arm joint part J1 becomes a straight line almost perpendicular to a direction of loading and unloading the workpieces; and a base 2 supporting a base side of the link mechanism 3 so as to make the base side of the link mechanism rotatable.

The link mechanism 3 is positioned at a base side (a side of the base 2) of the multi-joint industrial robot 1. The link mechanism 3 includes a base-side link part 4 supported by the base 2 so as to be rotatable, and an arm-side link part 5 positioned at a side of the arm part 6; wherein the base-side link part 4 and the arm-side link part 5 are connected by a link joint part J2. A mechanical structure of the link mechanism 3 is described more in detail in "(Mechanical structure & mechanical motion of the multi-joint industrial robot)".

The workpiece processing apparatus 20 is a device that carries out a prescribed processing operation for the workpieces 31, 32, 33, 34, and the workpiece processing apparatus 20 is placed at a position opposing the line of the four cassettes C1, C2, C3, C4. Though the workpiece processing apparatus 20 in FIG. 1 is simply placed at the position opposing the line of the four cassettes C1, C2, C3, C4, it may be placed at another position. For example, the workpiece processing apparatus 20 may be placed at a position on a straight line stretching from the motion trajectory of the arm joint part J1.

The four cassettes C1, C2, C3, C4 are placed in a row at intervals of 'L' in parallel with the motion trajectory of the arm joint part J1. The cassettes C1, C2, C3, C4 are placed at target positions to/from which the workpieces 31, 32, 33, 34 are loaded and unloaded. The cassettes may be replaced with any equipment other than cassettes, such as manufacturing devices, etc., as far as the loading and unloading positions are set in the same way as described above.

In the workpiece transfer system according to at least an embodiment of the present invention on this occasion; a position of the link mechanism 3 at a side of the base 2, i.e., a rotation center of the base-side link part 4 supported by the base 2 so as to be rotatable, and the arm joint part J1 that is another rotation center, are located at a position that is shifted (for a distance 'P') toward a side of the four cassettes C1, C2, C3, C4 away from the middle position between the workpiece processing apparatus 20 and the four cassettes. Then, while the link mechanism 3 operates, the link joint part J2 gets folded to protrude in a direction opposite to the above shifted direction.

Therefore, even when the number of cassettes placed in a row gets increased and lengths of the arm part 6 as well as the link mechanism 3 become longer; it is possible to prevent the link joint part J2 of the link mechanism 3 from a collision with any of the workpiece processing apparatus 20 and the cassettes. As a result, it is possible to prevent the workpiece transfer system from becoming greater as a whole, and eventually to enable space-saving of the system. Concretely to describe, in comparison with the conventional workpiece transfer system shown in FIG. 5, workpiece transfer can be done for a greater number of cassettes almost with no change of the dimensions 'M' and 'N' (or absolutely with no change at all) in the workspace of the multi-joint industrial robot, and therefore the workpiece transfer system can be implemented while enabling further space-saving.

In the present embodiment, the rotation center of the base-side link part 4 and the arm joint part J1 are located at the position that is shifted toward the side of the four cassettes C1, C2, C3, C4 away from the middle position described above. However, for example, the rotation center of the base-side link part 4 and the arm joint part J1 may also be located at a position that is shifted toward a side of the workpiece processing apparatus 20. On this occasion, the motion trajectory of the arm joint part J1 (the rotation center) is shifted toward a side of the workpiece processing apparatus 20, while the link joint part J2 gets folded to protrude in a direction toward a side of the cassettes C1, C2, C3, C4 away from the middle position. Furthermore, in the present embodiment, "the middle position" is defined as a position of a straight line composed of points that are equally distant from two straight lines (a position of a straight line passing through the middle point in a distance "2N" in FIG. 1); wherein a straight line connecting the centers of the workpieces stored in the plurality of cassettes is defined as one of the two straight lines and the other is a straight line which is parallel with the above straight line and included at the rear side of the workpiece processing apparatus. However, for example, "the middle position" may also be defined as a position of a straight line composed of points that are equally distant from two straight lines (a position of a straight line passing through the middle point in a distance "M" in FIG. 1); wherein a straight line included in a side of the multi-joint industrial robot 1 within the plurality of cassettes is defined as one of the two straight lines and the other is a straight line which is parallel with the above straight line and included in a side of the multi-joint industrial robot 1 within the workpiece processing apparatus 20. Namely, "the middle position" may be defined as a middle point in the distance "M" shown in FIG. 1, while the distance "M" exists between two opposing surfaces that are a front side of the workpiece processing apparatus 20 facing the multi-joint industrial robot 1 and a front side of the plurality of cassettes C1, C2, C3, C4 facing the multi-joint industrial robot 1. Furthermore, "the middle position" may be defined as a middle point in the distance "M" between the workpiece processing apparatus and the plurality of cassettes as shown in FIG. 5, while the distance "M" is a workspace of the multi-joint industrial robot between the workpiece processing apparatus and the plurality of cassettes. Still further, "the middle position" may also be defined as a middle point between a furthest reachable point of the hand part in a direction toward the workpiece processing apparatus and a furthest reachable point of the hand part in a direction toward the plurality of cassettes.

(Mechanical Structure & Mechanical Motion of the Multi-Joint Industrial Robot)

Figure 2:
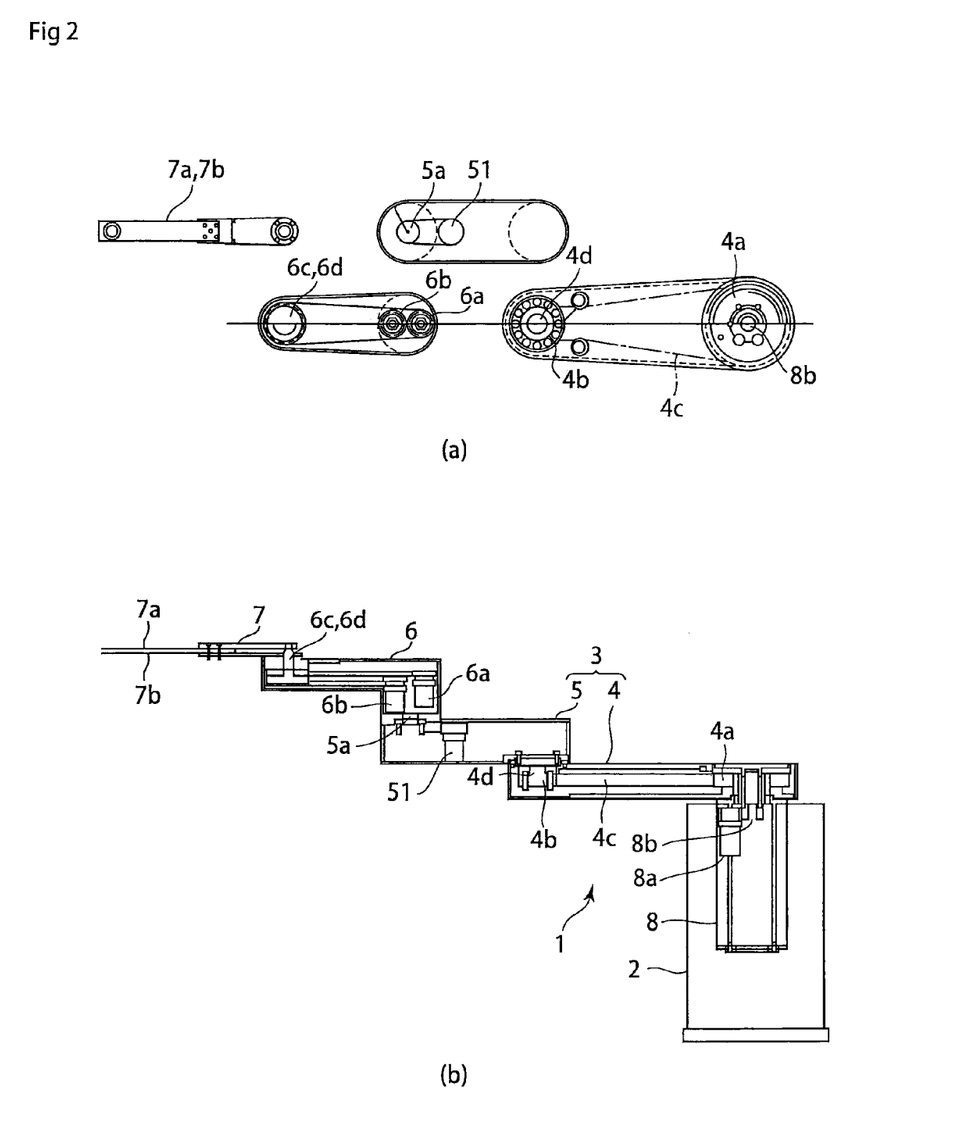
FIGS. 2(a) and 2(b) illustrate cross-sectional views showing a mechanical structure of a multi-joint industrial robot illustrated in FIG. 1.
Figure 3:
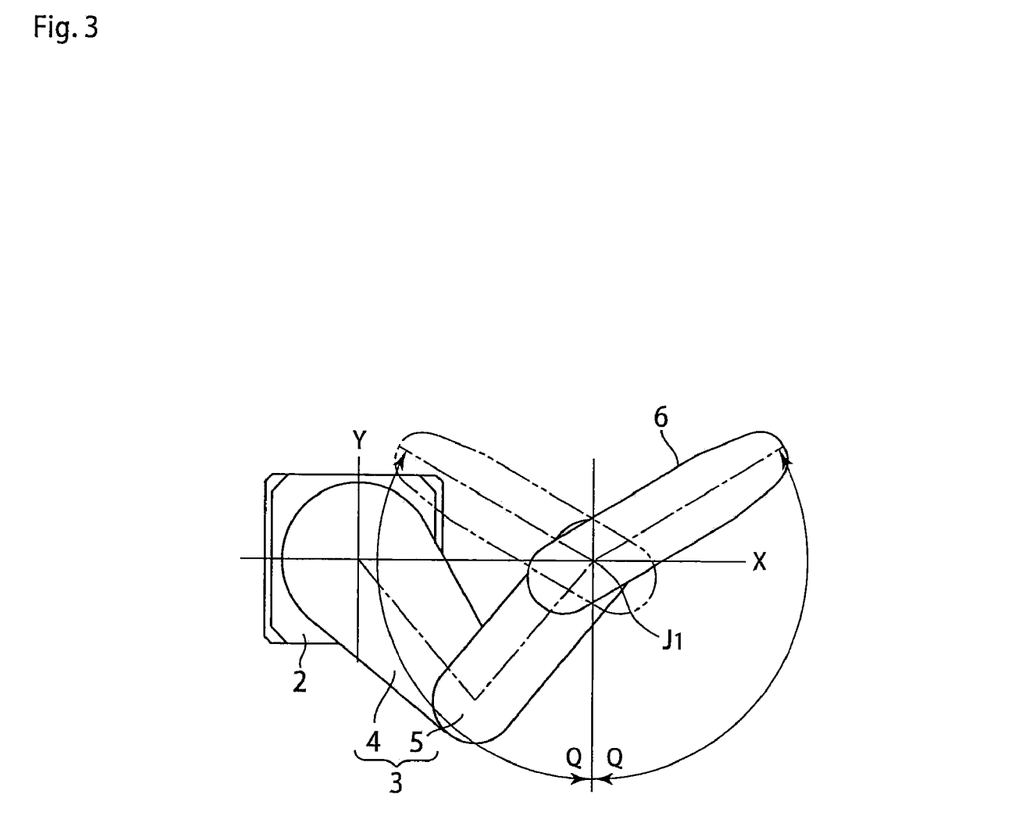
FIG. 3 shows an arm-swinging space of the multi-joint industrial robot illustrated in FIG. 1.

A mechanical structure and mechanical motion of the multi-joint industrial robot 1 shown in FIG. 1 is described below with reference to FIG. 1 through FIG. 3. FIGS. 2(a) and 2(b) illustrate cross-sectional views showing a mechanical structure of the multi-joint industrial robot 1 illustrated in FIG. 1, wherein FIG. 2(a) and FIG. 2(b) are a plan sectional view and a longitudinal sectional view, respectively. Furthermore, FIG. 3 shows an arm-swinging space of the arm part 6.

In FIGS. 2(a) and 2(b), the multi-joint industrial robot 1 includes: the base 2, the link mechanism 3, the arm part 6, and the hand part 7. Meanwhile, the link mechanism 3 includes the base-side link part 4 and the arm-side link part 5, which are connected each other so as to be rotatable. The base 2 has a lifting cylinder 8 that moves up and down vertically according to turning operation of a lifting motor (not shown). Namely, the lifting cylinder 8 moves up and down vertically while being guided along a guide shaft (not shown) whose longitudinal direction lies in the vertical direction of the figure.

The base-side link part 4 is connected to the lifting cylinder 8 through a connecting shaft 8b, and supported so as to be rotatable by a link mechanism motor 8a embedded in the lifting cylinder 8. The base-side link part 4 can move up and down with relation to the base 2 according to moving up and down of the lifting cylinder 8. The base-side link part 4 includes: a base-side pulley 4a, an arm-side pulley 4b, and a belt 4c. Meanwhile, the ratio in diameters of the base-side pulley 4a and the arm-side pulley 4b is 2:1. The arm-side pulley 4b and the arm-side link part 5 are connected with a connecting shaft 4d. Therefore, when the base-side link part 4 rotates around a rotation center of the base-side pulley 4a; the ratio in rotation angles of the base-side pulley 4a and the arm-side pulley 4b, i.e., the ratio in rotation angles of the base-side link part 4 and the arm-side link part 5, is 1:2. Furthermore, the base-side link part 4 and the arm-side link part 5 are the same in their length. As a result, in the link mechanism 3, a motion trajectory of a center of a connecting shaft 5a (the arm joint part J1), at which the arm-side link part 5 and the arm part 6 are connected each other so as to be rotatable, is restricted onto a prescribed straight line.

The arm part 6 is connected to a top end of the arm-side link part 5 through the connecting shaft 5a, while being supported so as to be rotatable by an arm part motor 51 embedded in the arm-side link part 5. In FIGS. 2(a) and 2(b), as a matter of convenience for explanation, the arm part motor 51 is embedded in the arm-side link part 5. However, at least an embodiment of the present invention is not limited to this arrangement, and the arm part motor 51 may be embedded in the arm part 6 for example, or may be placed at any other position.

The hand part 7 includes two frames, i.e., an upper holding frame 7a and a lower holding frame 7b, which are parallel with each other. The upper holding frame 7a and the lower holding frame 7b are connected to a top end of the arm part 6 through a connecting shaft 6c and another connecting shaft 6d, respectively; and supported so as to be rotatable by an upper holding frame motor 6b and a lower holding frame motor 6a, respectively, which are embedded in the arm part 6.

Control signals for driving the lifting motor (not shown), the link mechanism motor 8a, the arm part motor 51, the lower holding frame motor 6a, and the upper holding frame motor 6b are timely transmitted from a controller (not shown) according to a program entered by an operator. The controller is so placed as to enable being connected to a manipulator the multi joint industrial robot 1) with a cable, and the controller may be located at any position as far as it does not collide with any other apparatus.

As shown in FIG. 3, the multi-joint industrial robot 1 according to the present embodiment has a restriction on an arm-swinging space of the arm part 6 at a side of the shifted position described beforehand. Concretely to describe, as shown in FIG. 3, the arm part 6 can rotate only in a range of 'Q' in both the CW and CCW directions (For example, Q=120 degrees. However, this value can be defined freely as required). Namely, in the case shown in FIG. 1, the arm part 6 can rotate freely at the side opposite to the side of the shifted position described above; i.e., the side of the workpiece processing apparatus 20; but at the side of the cassettes C1, C2, C3, C4, the arm part 6 can rotate only in the restricted angular range. Accordingly, the workspace of the arm part 6 becomes a flattened-oval shape (Refer to FIG. 1), in which a part of the conventional oval shape (Refer to FIG. 5) is cut out. As a result, the installation space for the workpiece transfer system can be used efficiently.

Mechanical motion of the multi joint industrial robot 1 shown in FIG. 1 is generally described below. Currently at first, the multi-joint industrial robot 1 has its posture as illustrated at the right-hand side (with solid line) in FIG. 1. Then, the upper holding frame 7a of the hand part 7 moves linearly in the positive direction of the Y-axis to take the workpiece 34 out of the cassette while keeping its orientation as it is. To describe more in detail, the arm part 6 rotates around the arm joint part J1 in the left-ward direction (the CCW direction) by the arm part motor 51 (Refer to FIGS. 2(a) and 2(b)), while the upper holding frame 7a of the hand part 7 rotates around the connecting shaft 6c in the right-ward direction (the CW direction) by the upper holding frame motor 6b. At the time, the motion trajectory of the arm joint part J1 (from J1 to J'1) creates a straight line in a direction (the negative direction of the X-axis) perpendicular to the direction of unloading the workpiece. Meanwhile, the link joint part J2 gets folded to protrude to a position J'2 of the link joint part. When the upper holding frame 7a of the hand part 7 moves in the positive direction of the Y-axis for a specified distance, the upper holding frame 7a of the hand part 7 enters the cassette. Incidentally, 'the CW (clockwise) direction' and 'the CCW (counterclockwise) direction' described above mean 'the right-ward direction' and 'the left-ward direction', respectively, when the multi-joint industrial robot 1 is viewed from an upper position (Refer to FIG. 1). Furthermore, 'the negative direction of the X-axis' and 'the positive direction of the X-axis' described above mean 'the left-ward direction' and 'the right-ward direction', respectively, when the multi-joint industrial robot 1 is viewed from an upper position (Refer to FIG. 1).

Then, after the workpiece is mounted on the upper holding frame 7a of the hand part 7 (Refer to a posture of the multi-joint industrial robot 1 illustrated at the right-hand side (with broken line) in FIG. 1), operations are carried out in due order reverse to those described above so that the multi joint industrial robot 1 restores its posture as illustrated at the right-hand side (with solid line) in FIG. 1. For taking out the workpiece 31, stored in the left end cassette C1, as a next work step; the link mechanism 3 and the arm part 6 take actions to move the arm joint part J1 in the negative direction of the X-axis (so that the multi-joint industrial robot 1 has its posture as illustrated at the left-hand side (with broken line) in FIG. 1), and then operations are carried out in the similar manner as described above. Workpiece placement for each shelf of the cassette is implemented through moving the lifting cylinder 8 up and down slightly by turning operation of the lifting motor (not shown). Further to describe, moving the lifting cylinder 8 up and down by turning operation of the lifting motor (not shown) makes it possible to take out and bring in the workpieces 31, 32, 33, 34 from/to shelves at different elevations of each cassette, as required, and also to take out and bring in the same from/to the workpiece processing apparatus 20.

Figure 4:
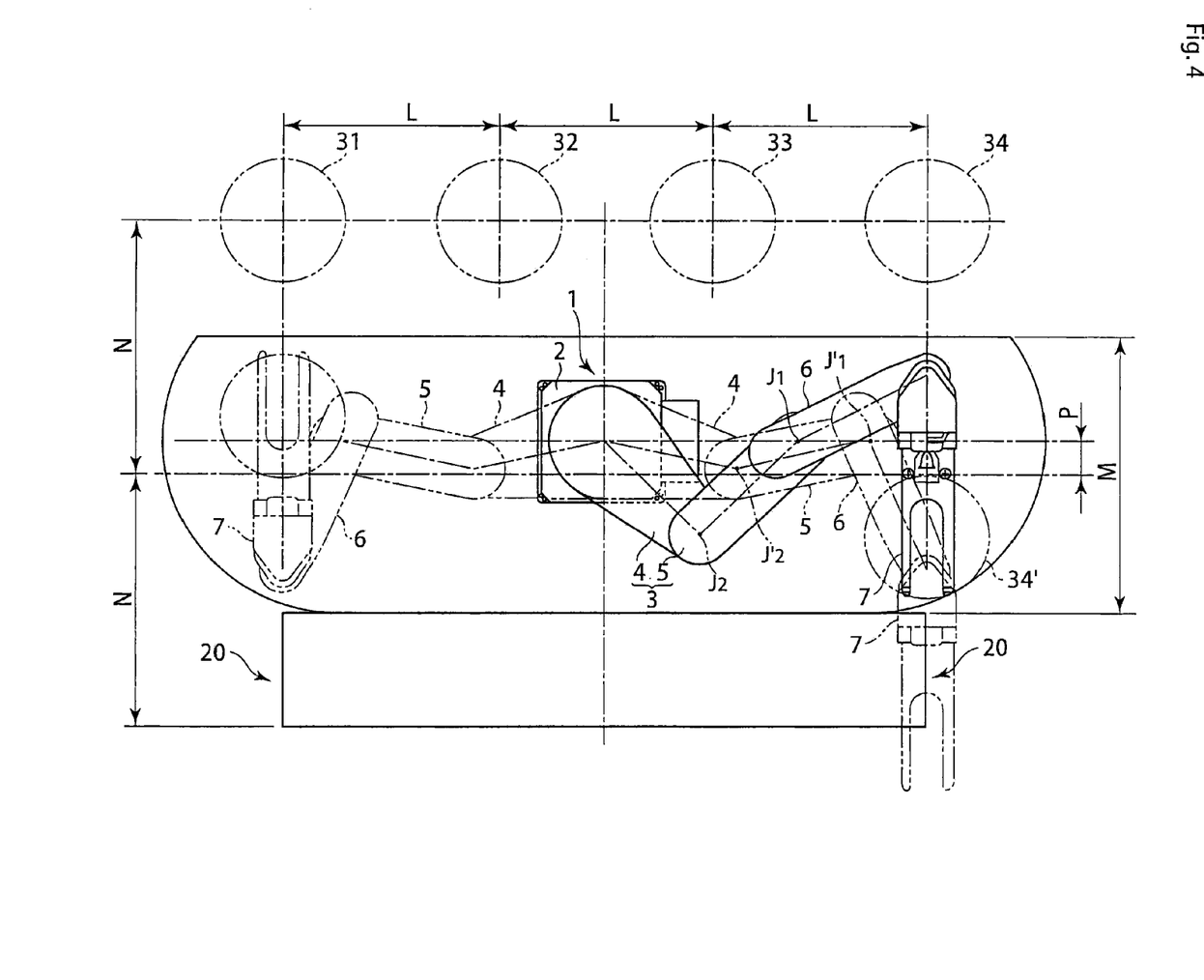
FIG. 4 shows loading and unloading a workpiece to/from a workpiece processing apparatus.

FIG. 4 shows loading and unloading a workpiece to/from the workpiece processing apparatus 20.

As shown in FIG. 4, for loading the workpiece 31 taken out of the cassette for example, it is also possible to rotate the arm part around the arm joint part J1 in the left-ward direction (the CCW direction) while moving the arm joint part J1 in the positive direction of the X-axis (Refer to the posture of the multi-joint industrial robot 1 illustrated at the right-hand side (with solid line) in FIG. 4.), and to enter the upper holding frame 7a of the hand part 7 into the workpiece processing apparatus 20.

As described above, the workpiece transfer system according to the present embodiment makes it possible to prevent the protruding link joint part J2 of the link mechanism 3 from a collision with any of the workpiece processing system 20 and the plurality of cassettes even when the lengths of the arm part 6 as well as each part of the link mechanism 3 (including the base-side link part 4 and the arm-side link part 5) become longer for dealing with cassettes C1, C2, C3, C4 of a 4-'FOUP' unit as shown in FIG. 1 and FIG. 4. Therefore, the workpiece transfer system prevents the system itself as a whole from becoming larger and eventually enables space-saving of the system. Furthermore, since the arm-swinging space of the arm part 6 is limited to a certain range, the installation space for the workpiece transfer system can be used efficiently.

In the present embodiment, the rotation center of the base-side link part 4 installed on the base 2 of the multi-joint industrial robot 1 and the arm joint part J1 are located at a position that is shifted toward a side of the plurality of cassettes away from the middle position between the workpiece processing apparatus 20 and the plurality of cassettes. However, it is not necessarily required to have these positions always located as described above. For example, these positions may come and go by making use of a sliding mechanism between the middle position, placed between the workpiece processing apparatus 20 and the plurality of cassettes, and the shifted position.

As described above, at least an embodiment of the present invention enables workpiece transfer operation for a greater number of cassettes placed in a row, and meanwhile it also makes it possible to prevent the workpiece transfer system itself as a whole from becoming larger.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A workpiece transfer system, the workpiece transfer system comprising:
    a plurality of cassettes for storing workpieces;
    at least one workpiece processing apparatus placed at a position opposing the plurality of cassettes; and
    a multi-joint industrial robot structured to load and unload workpieces to/from the cassettes, the multi-joint industrial robot comprising:
        a hand part structured to hold a workpiece;
        an arm part supporting the hand part so as to make the hand part rotatable; and
        a link mechanism that supports an arm joint part, positioned at a base side of the arm part, so as to make the arm joint part rotatable;
    wherein the link mechanism is structured to operate in such a manner that a motion trajectory of the arm joint part is a straight line substantially perpendicular to the direction of loading and unloading the workpieces; and
    the link mechanism comprises a base-side link part supported by a base of the multi-joint industrial robot so as to be rotatable, and an arm-side link part positioned at a side of the arm part while the base-side link part and the arm-side link part are connected by a link joint part;
    wherein the plurality of cassettes are placed in a row in parallel with the motion trajectory of the arm joint part;
    wherein the base-side link part and the arm-side link part of the link mechanism carry out expanding and folding motion so that the arm joint part is moved along the motion trajectory for locating the hand part at a position opposing each of the plurality of cassettes;
    wherein a rotation center of the base-side link part of the link mechanism which is disposed on the base is set to be at a position that is shifted toward a side of one of the workpiece processing apparatus and the plurality of cassettes, away from a middle position between the workpiece processing apparatus and the plurality of cassettes;
    wherein the motion trajectory of the arm joint part is formed to be located at a shifted position that is shifted toward a same side as rotation center of the base-side link part away from the middle position;
    the link joint part gets folded to protrude in a direction opposite to the shifted position at a time of expanding and folding motion of the link mechanism and at the time of loading and unloading the workpieces to/from the plurality of cassettes and the workpiece processing apparatus according to operation of the link mechanism.

2. The workpiece transfer system according to claim 1:
wherein the middle position between the workpiece processing apparatus and the plurality of cassettes is selected from the group consisting of:
    a position of a straight line composed of points that are equally distant from a first straight line and a second straight line where the first straight line is a straight line connecting the centers of the workpieces stored in the plurality of cassettes while the second straight line is another straight line included at a rear side of the workpiece processing apparatus and being parallel with the first straight line;
    a middle position between a surface of the workpiece processing apparatus and a surface of the plurality of cassettes, the two surfaces opposing each other;
    a middle position between the workpiece processing apparatus and the plurality of cassettes in a workspace of the multi-joint industrial robot between the workpiece processing apparatus and the plurality of cassettes; and
    a middle position between a furthest reachable point of the hand part in a direction toward the workpiece processing apparatus and a furthest reachable point of the hand part in a direction toward the plurality of cassettes.

3. The workpiece transfer system according to claim 1:
wherein an arm-swinging space of the arm part is restricted at a side of the above shifted position.

4. The workpiece transfer system according to claim 3:
wherein the arm part can swing within a range of 240 degrees at a side opposite to the side of the above shifted position.

5. The workpiece transfer system according to claim 2:
wherein an arm-swinging space of the arm part is restricted at a side of the above shifted position.

6. The workpiece transfer system according to claim 5:
wherein the arm part can swing within a range of 240 degrees at a side opposite to the side of the above shifted position.

7. The workpiece transfer system of claim 1, wherein the link mechanism is operated by a link mechanism motor, the arm part is rotated by an arm part motor, and the hand part is rotated by a motor for the hand part.

* * * * *